United States Patent [19]

McGarry

[11] Patent Number: 5,417,735
[45] Date of Patent: May 23, 1995

[54] INTERDIFFUSED CHROMIUM/NICKEL CORROSION-RESISTANT COATING FOR FIBERGLASS SPINNER BORES

[76] Inventor: Dennis L. McGarry, 3572 Deeds Rd., Granville, Ohio 43023

[21] Appl. No.: 172,338

[22] Filed: Dec. 23, 1993

[51] Int. Cl.⁶ .............................................. C03B 37/04
[52] U.S. Cl. ........................................ 65/492; 65/521; 65/374.12; 427/438; 427/250; 427/255.1
[58] Field of Search ................... 65/1, 2, 374.12, 15, 65/492, 516, 521; 427/438, 250, 255.1, 376, 8

[56] References Cited

U.S. PATENT DOCUMENTS

| | | | |
|---|---|---|---|
| 2,980,954 | 4/1961 | Levecque | 65/15 |
| 3,031,717 | 5/1962 | Levecque | 65/15 |
| 4,028,116 | 6/1977 | Cedarleaf | 106/1 |
| 4,152,164 | 5/1979 | Gulla | 427/438 |
| 4,511,383 | 4/1985 | Bhatti | 65/374.12 |
| 4,767,432 | 8/1988 | Gaul | 65/374.12 |
| 5,312,469 | 5/1994 | Houston | 65/6 |

OTHER PUBLICATIONS

Johnson, D. C. "Platinum Coating Technique Developed for the Glass Industry" Sep. 1987 *Glass*.

*Primary Examiner*—W. Gary Jones
*Assistant Examiner*—John Hoffmann
*Attorney, Agent, or Firm*—Charles H. Ellerbrock; Ted C. Gillespie; C. Michael Gegenheimer

[57] ABSTRACT

A corrosion-resistant fiberglass spinner is prepared by applying consecutive, alternating layers of chromium and nickel to the bores of the spinner, and thereafter thermally interdiffusing the chromium and nickel to form a corrosion-resistant coating.

18 Claims, 1 Drawing Sheet

INTERDIFFUSED CHROMIUM/NICKEL CORROSION-RESISTANT COATING FOR FIBERGLASS SPINNER BORES

FIELD OF THE INVENTION

This invention relates to an interdiffused chromium/nickel corrosion-resistant coating for fiberglass spinner bores. More particularly, the invention is directed to a method for applying consecutive, alternating layers of chromium and nickel to fiberglass spinner bores and thermally interdiffusing said layers, to produce a corrosion-resistant coating; and to the fiberglass spinners produced thereby.

BACKGROUND OF THE INVENTION

In certain industrial applications, such as the production of fiberglass wool for preparing thermal or acoustical insulation products, there is a need for metal alloys which posses certain characteristics such as high rupture strength, high corrosion resistance, and high oxidation resistance at elevated temperatures. In the fiberglass and mineral fibers industries, filaments which may be used for preparing such insulation products are produced by passing molten glass or mineral through the bores of the foraminous wall of a chamber which is adapted for rotation at high angular velocities (said chamber being known as a fiberglass spinner). The filaments are extruded through the fiberizing bores due to the centrifugal action of the rotating spinner. Such spinners are typically operated at a temperature of about 2,050° F. and an angular velocity of about 2,050 RPM. It is advantageous, from a fiberglass production cost standpoint, for the angular velocity to be as high as possible so as to maximize the rate at which filaments are extruded through the fiberizing bores. However, high spinner angular velocities result in reduced spinner life due to the limited corrosion resistance of typical spinner base metal alloys. The flow of molten glass or mineral through the spinner bores corrodes the cylindrical walls of the bores causing them to enlarge, resulting in a loss of control of fiber diameter.

It is well-known in the fiberglass manufacturing art to apply a layer of platinum or other precious metal or alloy over the surfaces of base metal components which contact the molten glass, to reduce the corrosion of the base metal alloy by the glass. The bores of fiberglass spinners are especially susceptible to corrosion caused by molten glass. Johnson, D. C. "Platinum Coating Technique Developed for the Glass Industry," Glass, September 1987, page 372 discloses a method for applying a platinum coating to the surfaces of fiberglass spinner bores. The platinum coating is bonded directly to the spinner base metal alloy. Platinum and other precious metals are expensive, however, and therefore dramatically increase the costs associated with producing a corrosion-resistant spinner. Moreover, it has been found that platinum coatings result in an undesirable interdiffusion zone of complex intermetallic compounds which forms near the interface between the precious metal layer and base metal alloy.

It is known that an alloy comprising chromium and nickel, wherein the chromium concentration is above about 30 weight percent, is highly resistant to corrosion by molten glass. However, such chromium/nickel alloys, having high concentrations of chromium, as coatings for the surfaces of fiberglass spinner bores are unknown. U.S. Pat. No. 4,028,116 to Cedarleaf discloses a method for codepositioning chromium and nickel by electroless plating, wherein the achievable concentration of chromium is only up to 30% by weight.

It must be noted that the prior art referred to hereinabove has been collected and examined only in light of the present invention as a guide. It is not to be inferred that such diverse art would otherwise be assembled absent the motivation provided by the present invention, nor that the cited prior art when considered in combination suggests the present invention absent the teachings herein.

It would be desirable to coat the bores of a base metal alloy fiberglass spinner with a non-precious metal corrosion-resistant material.

SUMMARY OF THE INVENTION

Accordant with the present invention, there surprisingly has been discovered a process for preparing a corrosion-resistant fiberglass spinner, comprising:
 providing a spinner, comprising a foraminous wall including a plurality of bores having substantially cylindrical surfaces;
 applying consecutive, alternating layers of chromium and nickel to the surfaces of the bores; and
 heating the spinner to a temperature and for a time sufficient to at least partially interdiffuse the chromium and nickel layers.

The invention further includes a corrosion-resistant fiberglass spinner, comprising:
 a foraminous wall including a plurality of bores having substantially cylindrical surfaces; and
 an at least partially interdiffused coating of chromium and nickel adhered to the surfaces of the bores.

Moreover, the entire Specification including the claims comprises a summary of the present invention.

The present invention is particularly useful for manufacturing fiberglass spinners, to be used for the manufacture of fiberglass thermal or acoustical insulation products by conventional rotary forming techniques.

DETAILED DESCRIPTION OF THE PREFERRED EMBODIMENT

Figure 1:
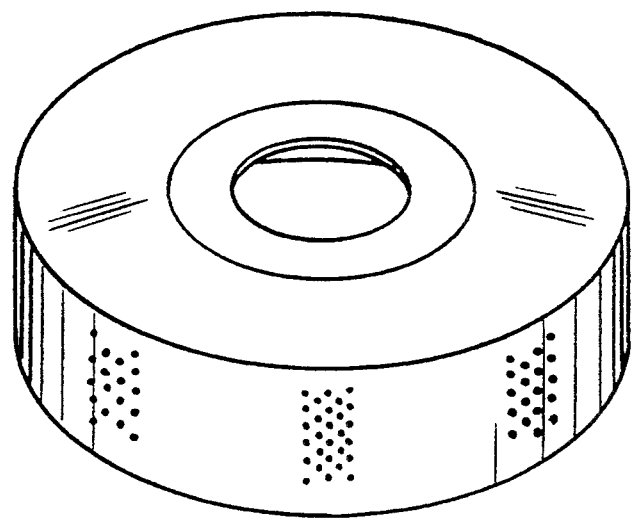
FIG. 1 is a view of a spinner produced according to this invention.
Figure 2:
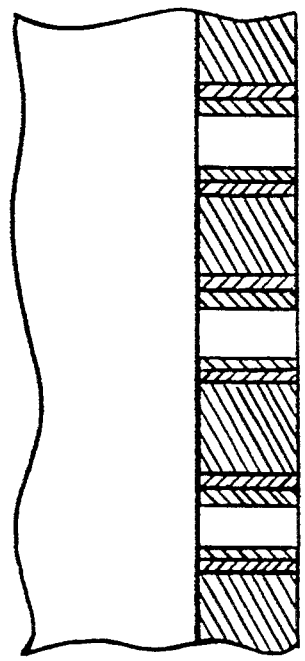
FIG. 2 is an exploded cross-sectional view of a side wall of the spinner of FIG. 1 showing multiple layers of chromium or nickel on the surfaces of the bores of the spinner.

The invention is directed to a process for manufacturing a corrosion-resistant fiberglass spinner, and to the spinner made thereby. The inventive spinner may be used to extrude glass or other molten mineral to produce fibers. By the term "fiberglass" as it is used herein is meant fibers of glass, slag, or other mineral material. The inventive spinner resists corrosion due to contact with molten glass or other molten minerals.

Fiberglass spinners are well-known in the art and comprise a generally cylindrical chamber which may be rotated at a high angular velocity. The periphery of the chamber is defined by a foraminous wall having a plurality (generally, from about a few hundred to about several thousand) of bores passing radially therethrough. The bores typically are less than one millimeter in diameter. Molten glass or other mineral material directed into the chamber is extruded through the bores in the foraminous wall upon rotation of the spinner. The bores are generally produced by laser drilling through the cylindrical wall of the chamber. The bores could likewise be formed by other conventional techniques such as, for example, mechanical drilling. Thus, the bores are substantially cylindrical in configuration. The spinners are generally made of a high rupture strength alloy containing chromium, nickel, and cobalt, as well as several other metals and/or refractory materials in small quantities. Typical spinners and spinner alloys are more fully set forth in U.S. Pat. Nos. 3,933,484, 4,820,324 and 4,877,435 which are incorporated herein in their entirety by reference thereto.

The corrosion-resistant fiberglass spinner of the present invention comprises consecutive, alternating layers of chromium and nickel applied to the spinner bores, which layers are then heated to a temperature and for a time sufficient to at least partially interdiffuse the chromium and nickel to form a chromium/nickel alloy corrosion-resistant coating. Either layer of chromium or nickel may be applied first to the base metal fiberglass spinner bores, followed by deposition of the other layer. Moreover, an odd or even number of chromium and/or nickel layers may be applied in an alternating fashion to the spinner bores, in identical or different thicknesses, and thereafter, thermally interdiffused to prepare the chromium/nickel alloy corrosion-resistant coating.

The chromium layer may be applied by any process conventionally known as useful for producing a substantially uniform layer of chromium on a metallic substrate such as, for example, by chemical vapor deposition wherein the chromium layer may be produced by reacting a mixture of a vaporized chromium compound and a reducing agent at or near the surface of the bores. A preferred chromium compound comprises chromous chloride and a preferred reducing agent comprises hydrogen. Typical concentrations of the mixed gases range from about 0.25 to about 10 mole percent chromium compound and about 2 to about 50 mole percent reducing agent; the balance being an inert carrier gas such as argon. Preferably, the range is from about 0.5 to about 3 mole percent chromium compound and about 3 to about 10 mole percent reducing agent. The chemical vapor deposition is generally conducted at a temperature from about 900° C. to about 1,150° C.; preferably from about 1,000° C. to about 1,100° C. At such temperatures, the chromium deposition rate is generally from about 1 to about 5 microns per hour. The thickness of the chromium layer may vary over wide limits from about 1 to about 50 microns. Preferably, the chromium layer ranges from about 5 to about 25 microns thick.

Such high temperature coating process as CVD can result in a chromium coating with a poorly defined thickness because of some interdiffusion taking placing during coating. The amount of chromium deposited can be determined by conducting chemical analysis on a very small dimensional scale after coating. One such common technique is called microprobe analysis. With microprobe analysis the preferred amount of chromium for coating can be established and related to the coating conditions. After the preferred coating conditions are identified further, microprobe analysis is not required.

The nickel layer may be applied by any method generally known as useful for producing a substantially uniform layer of nickel on a metallic substrate. One such method is by conventional low temperature chemical vapor deposition utilizing a vaporizable nickel compound and a reducing agent. A preferred method comprises electroless plating wherein nicked is applied from a plating bath by the reduction of nickel cations to metallic nickel, accompanied by the oxidation of hypophosphite anions to the corresponding phosphite anions. The plating bath generally comprises an aqueous solution containing nickel cations and hypophosphite anions. Nickel ions may be derived from any suitable nickel salt such as, for example, nickel sulfate or nickel chloride, or mixtures thereof. A preferred nickel salt comprises nickel sulfate. The hypophosphite ions may be derived from any suitable hypophosphite such as, for example, sodium hypophosphite or potassium hypophosphite, or mixtures thereof. A preferred hypophosphite comprises sodium hypophosphite. The pH of the plating bath may be varied over wide limits from about 2 to about 7, and may be controlled by the addition of organic and/or inorganic acids such as, for example, lactic acid, propionic acid, succinic acid, sulfuric acid, or hydrochloric acid, as well as mixtures thereof.

The concentrations of ingredients in the aqueous plating bath may vary over wide limits, as follows: nickel compound, from about 15 g/l to about 25 g/l; hypophosphite, from about 20 g/l to about 30 g/l; and acid, sufficient to achieve a pH from about 2 to about 7. The plating bath of the present invention may additionally contain conventional electroless plating bath adjuvants such as, for example, stabilizers, complexing agents, exalting additives, and the like, generally not exceeding 30 percent by weight of the plating bath. A preferred electroless plating bath comprises an aqueous solution of about 21 g/l nickel sulfate, about 24 g/l sodium hypophosphite, about 28 g/l lactic acid, about 2.2 g/l propionic acid, and about 1 g/l succinic acid, having a pH of about 4.4.

The plating bath is heated to a temperature up to about its boiling temperature, and the substrate to be nickel plated is immersed therein. The plating bath solution enters the bores of the fiberglass spinner immersed therein, to deposit a layer of nickel on the surfaces of the bores. Typical plating temperatures for aqueous electroless plating baths range up to about 95° C. The resulting rate of deposition is generally about 25 microns per hour. The thickness of the nickel layer may vary over wide limits from about 1 micron to about 50 microns. Preferably, the nickel layer ranges from about 5 to about 25 microns thick.

Following the deposition of at least one layer of chromium and at least one layer of nickel (in either order) upon the surfaces of the bores of the fiberglass spinner, the spinner is heated to a temperature and for a time sufficient to at least partially interdiffuse the chromium and nickel layers, to produce a chromium/nickel alloy corrosion-resistant coating on the surfaces of the fiberglass spinner bores. Ideally, complete interdiffusion is desired; however, this is not necessary to achieve corrosion-resistance. Depending upon the thicknesses of the chromium and nickel layers, the bulk average concentration of the chromium/nickel alloy coating (i.e., the coating formed from the originally applied chromium and nickel layers) may vary from about 5 to about 95 percent by weight chromium. A preferred range is from about 35 percent to about 65 percent, by weight. Interdiffusion of the layers is achieved by heating to a temperature as high as possible without causing deterioration of the spinner or chromium/nickel alloy coating. Advantageously, the heating process may be conducted up to temperatures of about 1,200° C. for periods of time up to about 8 hours. A preferred heat treatment schedule, resulting in substantially complete interdiffusion between the layers of chromium and nickel having a combined thickness of about 50 microns, comprises heating the coated spinner to a temperature of about 1,200° C. for a period of about 4 hours. It will be readily apparent to those ordinarily skilled in the art that the interdiffusion temperature and time requirements may vary widely depending upon such factors as the number of chromium and nickel layers, the thicknesses of the layers, the desired level of interdiffusion, etc.

Thus, a fiberglass spinner may be produced having an at least partially interdiffused chromium/nickel alloy corrosion-resistant coating on the surfaces of the bores thereof. The thickness of the coating may vary over wide limits, depending upon the operating conditions and operating life requirements of the spinner. Preferably, the coating thickness ranges from about 10 to about 50 microns.

It must be noted that the ingredients and process conditions described hereinabove for the deposition of sequential, alternating layers of chromium and nickel, and the subsequent interdiffusion of these layers, are not sharply critical to the successful practice of the present invention. The reactants and reaction conditions recited are generally disclosed in terms of their broadest application to the practice of the invention. Occasionally, the ingredients or reactions as described may not be applicable to each embodiment included within the disclosed scope. Those compounds and reaction conditions for which this occurs will readily be recognizable by those ordinarily skilled in the art. In all such cases, either the reactions may successfully be performed by conventional modifications known to those ordinarily skilled in the art, e.g., by employing conventional metal deposition and heat treatment methods, by changing to alternative conventional reagents, by routine modification of reaction conditions, etc., or other compounds or reaction conditions which are otherwise conventional will be applicable to the practice of the present invention.

From the foregoing description, one skilled in the art can easily ascertain the essential characteristics of this invention and, without departing from its spirit and scope, can make various changes and modifications to adapt the invention to various other uses and conditions.

What is claimed is:

1. A process for preparing a corrosion-resistant fiberglass spinner, comprising:
   providing a spinner, comprising a foraminous wall including a plurality of bores having substantially cylindrical surfaces;
   applying consecutive, alternating layers of chromium and nickel to the surfaces of the bores, at least one of the consecutive, alternative layers containing chromium and at least one of the consecutive, alternate layers containing nickel; and
   heating the spinner to a temperature and for a time sufficient to at least partially interdiffuse the chromium and nickel layers.

2. The process for preparing a corrosion-resistant fiberglass spinner according to claim 1, wherein the chromium is applied by chemical vapor deposition.

3. The process for preparing a corrosion-resistant fiberglass spinner according to claim 1, wherein the nickel is applied by electroless plating.

4. The process for preparing a corrosion-resistant fiberglass spinner according to claim 1, wherein the nickel is applied by chemical vapor deposition.

5. The process for preparing a corrosion-resistant fiberglass spinner according to claim 1, wherein each layer of the consecutive, alternative layers is applied to a thickness ranging from about 1 to about 50 microns.

6. The process for preparing a corrosion-resistant fiberglass spinner according to claim 5, wherein the thickness ranges from about 5 to about 25 microns.

7. The process for preparing a corrosion-resistant spinner according to claim 1, wherein a nickel layer is applied directly to the surfaces of the spinner bores.

8. The process for preparing a corrosion-resistant spinner according to claim 1, wherein a chromium layer is applied directly to the surfaces of the spinner bores.

9. The process for preparing a corrosion-resistant spinner according to claim 1, wherein the chromium and nickel layers have different thicknesses.

10. The process for preparing a corrosion-resistant spinner according to claim 1, wherein the heating of the spinner is carried out at a temperature of up to about 1,200° C. and maintained at that temperature for up to about 8 hours.

11. The process for preparing a corrosion-resistant spinner according to claim 1 wherein more than one layer of chromium is applied in the applying of the consecutive, alternating layers.

12. A corrosion-resistant fiberglass spinner producible by the process of claim 1.

13. A process for preparing a corrosion-resistant fiberglass spinner, comprising:
   providing a spinner, comprising a foraminous wall including a plurality of bores having substantially cylindrical surfaces;
   applying, by chemical vapor deposition and electroless plating respectively, consecutive, alternating layers of chromium and nickel to the surfaces of the bores, at least one of said consecutive, alternating layers containing chromium having a thickness from about 5 to about 25 microns, at least one of said consecutive, alternating layers containing nickel having a thickness from about 5 to about 25 microns; and
   heating the spinner to a temperature of up to about 1,200° C. for a period of up to about 8 hours to at least partially interdiffuse the chromium and nickel layers.

14. A corrosion-resistant fiberglass spinner, comprising:
   a foraminous wall including a plurality of bores having substantially cylindrical surfaces; and
   an interdiffused coating of chromium and nickel adhered to the surfaces of the bores.

15. The corrosion-resistant fiberglass spinner according to claim 14, wherein the bulk average concentration of chromium in the interdiffused coating is from about 5 to about 95 percent by weight.

16. The corrosion-resistant fiberglass spinner according to claim 14, wherein the thickness of the interdiffused coating is from about 10 to about 50 microns.

17. A corrosion-resistant fiberglass spinner comprising:
   a foraminous wall including a plurality of bores having substantially cylindrical surfaces; and
   a partially interdiffused coating of chromium and nickel adhered to the surfaces of the bores, the bulk average concentration of chromium in said interdiffused coating being from about 35 to about 65 percent by weight, the thickness of said interdiffused coating being from about 10 to about 50 microns.

18. A corrosion-resistant fiberglass spinner producible by the process of claim 13.

* * * * *